(12) United States Patent
Shimizu et al.

(10) Patent No.: US 8,514,614 B2
(45) Date of Patent: Aug. 20, 2013

(54) MAGNETIC MEMORY

(75) Inventors: Takafumi Shimizu, Tokyo (JP); Kenji Tsuchida, Kawasaki (JP); Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 456 days.

(21) Appl. No.: 12/885,175

(22) Filed: Sep. 17, 2010

(65) Prior Publication Data

US 2011/0063900 A1    Mar. 17, 2011

(30) Foreign Application Priority Data

Sep. 17, 2009    (JP) .................. 2009-216060

(51) Int. Cl.
*G11C 11/00*    (2006.01)
(52) U.S. Cl.
USPC ........... 365/158; 365/171; 365/173; 365/148; 365/189.15
(58) Field of Classification Search
USPC ............. 365/158, 171, 173, 148, 189.15
See application file for complete search history.

(56) References Cited

U.S. PATENT DOCUMENTS

| | | | |
|---|---|---|---|
| 7,394,685 B2 | 7/2008 | Ooishi et al. | |
| 2010/0014347 A1 * | 1/2010 | Wang et al. | 365/171 |

FOREIGN PATENT DOCUMENTS

JP    2007-115320    5/2007

OTHER PUBLICATIONS

Kawahara et al., "2Mb SPRAM (SPin-Transfer Torque RAM) With Bit-by-Bit Bi-Directional Current Write and Parallelizing-Direction Current Read," IEEE Journal of Solid-State Circuits, vol. 43, No. 1, Jan. 2008, pp. 109-120.
Background Art Information.

* cited by examiner

*Primary Examiner* — Vu Le
*Assistant Examiner* — Han Yang
(74) *Attorney, Agent, or Firm* — Knobbe, Martens, Olson & Bear LLP

(57) ABSTRACT

According to one embodiment, a magnetic memory includes a magnetoresistive element includes a fixed layer whose magnetization direction is fixed, a recording layer whose magnetization direction is variable and a nonmagnetic layer disposed between the fixed layer and the recording layer. A direction of a read current is set to a first direction in a case where an expression of MR ratio $\geq |I_{c+}/I_{c-}|-1$ is satisfied if a critical current of the first direction used to write the magnetoresistive element to the parallel state is set to $I_{c-}$ and a critical current of a second direction used to write the magnetoresistive element to the anti-parallel state is set to $I_{c+}$.

8 Claims, 4 Drawing Sheets

"0" State  
(a)

"1" State  
(b)

US 8,514,614 B2

MAGNETIC MEMORY

CROSS-REFERENCE TO RELATED APPLICATIONS

This application is based upon and claims the benefit of priority from Japanese Patent Application No. 2009-216060, filed Sep. 17, 2009; the entire contents of which are incorporated herein by reference.

FIELD

Embodiments described herein relate generally to a magnetic memory.

BACKGROUND

Recently, a semiconductor memory utilizing a variable resistance element as a memory element, for example, a magnetic random access memory (MRAM) has attracted attention and has been developed. The MRAM uses, as a memory element, a magnetic tunnel junction (MTJ) element utilizing a magnetoresistive effect such that the resistance varies according to the magnetization direction. Particularly, a large resistance variation can be attained in a tunneling magnetoresistive (TMR) element utilizing a TMR effect.

The MTJ element has a structure in which one nonmagnetic layer (for example, an insulating layer) is sandwiched between two ferromagnetic layers. The magnetization direction of one (fixed layer) of the ferromagnetic layers is fixed, but the magnetization direction of the other ferromagnetic layer (recording layer) is not fixed and the magnetization direction of the recording layer is set in parallel to or anti-parallel to the magnetization direction of the fixed layer. The TMR effect is a phenomenon in which the resistance of the MTJ element varies according to the relative relationship (parallel/anti-parallel) between the two magnetization directions. Specifically, when the magnetization direction of the recording layer is set in parallel to that of the fixed layer, a current tends to pass through the insulating layer (the resistance thereof becomes smaller) and when the magnetization direction of the recording layer is set in anti-parallel to that of the fixed layer, a current is difficult to pass through the insulating layer (the resistance thereof becomes larger). If the relative relationship between the two magnetization directions is set to correspond to "0" or "1", a memory element by means of which data written in the MTJ element can be read according to the resistance can be formed.

In the above MRAM, a so-called spin-transfer MRAM with which data write and read operations are performed by directly passing a current through the MTJ element is known. When reading data in the spin-transfer MRAM, it is necessary to prevent occurrence of an erroneous write operation caused by a read current. For this purpose, for example, the direction of the read current is set equal to and in parallel to the magnetization directions of the recording layer and fixed layer (for example, Jpn. Pat. Appln. KOKAI Publication No. 2007-115320).

However, the process of determining the direction of the current is based on a bi-directional critical current in which inversion of magnetization occurs at the write time is symmetrical (the absolute values are equal). In practice, however, the critical current in magnetization inversion obtained by experiments is asymmetrical and has a problem that the asymmetric property is not taken into consideration. Therefore, there occurs a possibility that erroneous writing (write disturbance) occurs when reading data.

DETAILED DESCRIPTION

Figure 1:
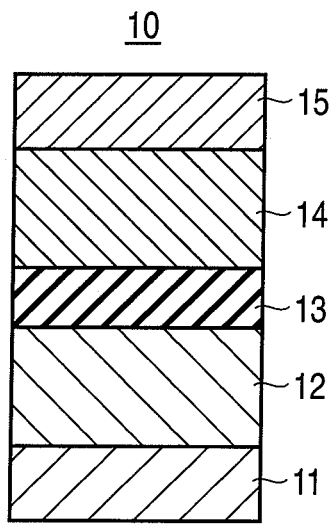
FIG. 1 is a cross-sectional view showing the structure of an MTJ element 10 according to a first embodiment.

In general, according to one embodiment, there is provided a magnetic memory comprising:

a magnetoresistive element comprising a fixed layer whose magnetization direction is fixed, a recording layer whose magnetization direction is variable and a nonmagnetic layer disposed between the fixed layer and the recording layer, wherein an MR ratio is expressed by MR ratio=(Rap−Rp)/Rp if a resistance value obtained when the magnetization directions of the fixed layer and recording layer are set to a parallel state is set to Rp and a resistance value obtained when the magnetization directions of the fixed layer and recording layer are set to an anti-parallel state is set to Rap, and a direction of a read current is set to a first direction in a case where an expression of MR ratio $|I_{c+}/I_{c-}|-1$ is satisfied if a critical current of the first direction used to write the magnetoresistive element to the parallel state is set to $I_{c-}$ and a critical current of a second direction used to write the magnetoresistive element to the anti-parallel state is set to $I_{c+}$.

The embodiments will be described hereinafter with reference to the accompanying drawings. In the description which follows, the same or functionally equivalent elements are denoted by the same reference numerals, to thereby simplify the description.

(First Embodiment)

In this embodiment, a magnetic random access memory (MRAM) is used as a resistance-change memory. The MRAM includes an MTJ element utilizing a magnetoresistive effect as a memory element and stores data based on the magnetization arrangement of the MTJ element. Further, the MRAM of this embodiment is a spin-transfer MRAM in which data is written by directly passing a bi-directional current through the MTJ element.

FIG. 1 is a cross-sectional view showing the structure of a magnetoresistive element (MTJ element) 10 according to the first embodiment. The MTJ element 10 is formed by sequentially stacking a lower electrode 11, fixed layer (reference layer) 12, nonmagnetic layer 13, recording layer (free layer) 14 and upper electrode 15. The stacking order of the layers configuring the MTJ element 10 may be reversed.

The fixed layer 12 is formed of a ferromagnetic material and the magnetization direction thereof is fixed (invariable). For example, the magnetization direction of the fixed layer 12 can be fixed by disposing an anti-ferromagnetic layer (not shown) adjacent to the fixed layer 12. The recording layer 14 is formed of a ferromagnetic material and the magnetization direction thereof is variable. In this case, "the magnetization direction of the fixed layer 12 is fixed" means that the magnetization direction of the fixed layer 12 is kept unchanged even if a write current that reverses the magnetization direction of the recording layer 14 is passed therethrough.

The nonmagnetic layer 13 is formed of a nonmagnetic metal, nonmagnetic semiconductor or insulator. When an insulator is used as the nonmagnetic layer 13, it is called a tunnel barrier layer and when a metal is used as the nonmagnetic layer 13, it is called a spacer layer. The nonmagnetic layer 13 is desired to have such film thickness as to sufficiently isolate the fixed layer 12 from the recording layer 14 so that any interaction between the fixed layer 12 and the recording layer 14 can be neglected. At the same time, spins of electrons are required not to be inverted until conduction electrons that have passed through the fixed layer 12 reach the recording layer 14 when a write current is passed through the MTJ element 10. Therefore, it is desirable to set the film thickness of the nonmagnetic layer 13 smaller than the spin diffusion length.

The directions of easy magnetization of the fixed layer 12 and recording layer 14 may be set perpendicular to the film surface (perpendicular magnetization) or may be set in parallel to the film surface (in-plane magnetization). In the case of perpendicular magnetization, it is unnecessary to control the element shape in order to determine the magnetization direction, unlike the case of in-plane magnetization, which is advantageous in that perpendicular magnetization suitable for miniaturization can be attained.

The resistance of the MTJ element 10 thus configured varies depending on whether the magnetization arrangements of the fixed layer 12 and recording layer 14 are set parallel or anti-parallel. The MTJ element 10 is used as a memory element by assigning the variation in the resistance to "0" data or "1" data.

Figure 2:
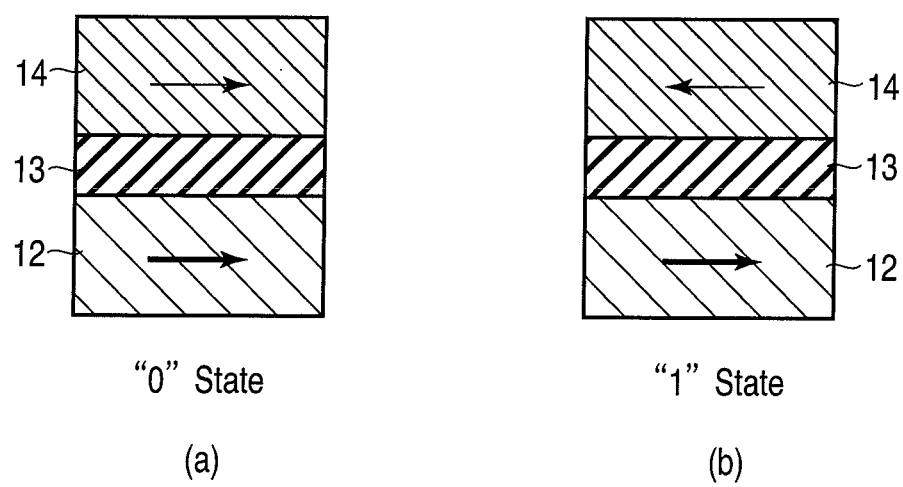
FIG. 2 is a schematic view for illustrating the low-resistance state and high-resistance state of the MTJ element 10.

FIG. 2 is a schematic view for illustrating the low-resistance state and high-resistance state of the MTJ element 10. Arrows in FIG. 2 indicate the magnetization directions. Further, FIG. 2 shows an in-plane magnetization MTJ element 10 as one example, but the embodiment is not limited to this case and may be applied to a perpendicular magnetization MTJ element as described before.

When the magnetization directions of the fixed layer 12 and recording layer 14 are parallel (in the same direction) as shown in FIG. 2(a), the resistance of the MTJ element 10 becomes minimum. This state is set to a "0" state (low-resistance state). When the magnetization directions of the fixed layer 12 and recording layer 14 are anti-parallel (in opposite directions) as shown in FIG. 2(b), the resistance of the MTJ element 10 becomes maximum. This state is set to a "1" state (high-resistance state). Thus, in the MRAM, the two states in which the resistance of the MTJ element 10 differs are set to correspond to the storage states of "0" data and "1" data.

Figure 3:
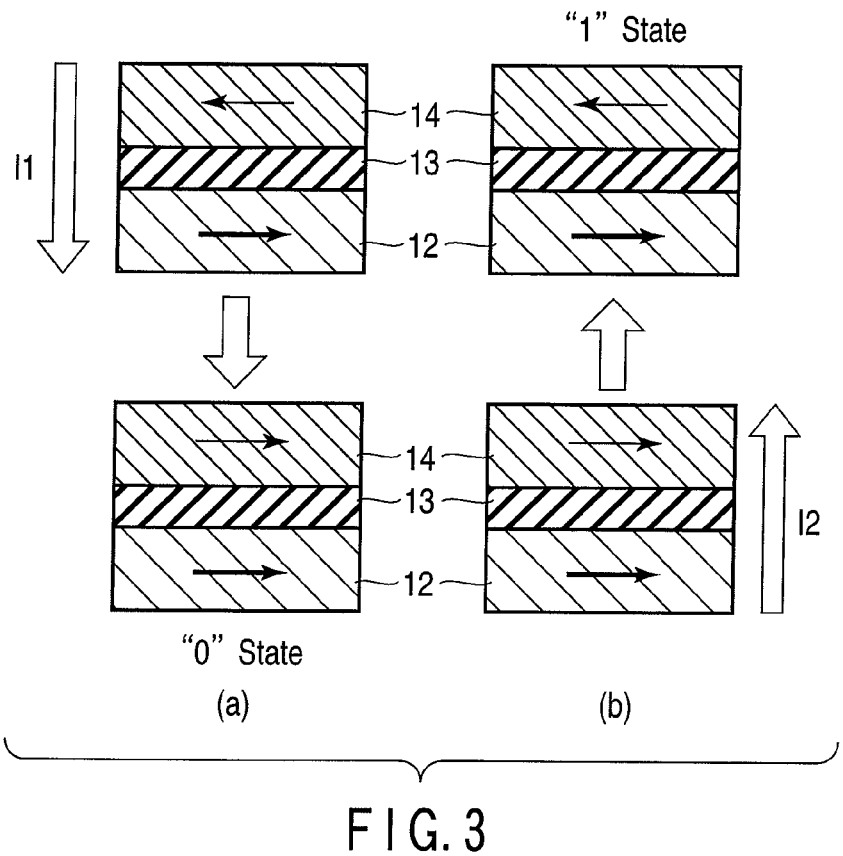
FIG. 3 is a view for illustrating the current direction when data is written to the MTJ element 10.

FIG. 3 is a view for illustrating the current direction when data is written to the MTJ element 10. When the magnetization directions of the fixed layer 12 and recording layer 14 are changed from the anti-parallel state to the parallel state as shown in FIG. 3(a), a write current I1 that flows from the recording layer 14 to the fixed layer 12 via the tunnel barrier layer 13 is supplied to the MTJ element 10. As a result, spin-polarized electrons are injected into the recording layer 14 and magnetization inversion of the recording layer 14 occurs when the critical current is exceeded. Therefore, the magnetization directions of the fixed layer 12 and recording layer 14 are set to the parallel state.

Further, when the magnetization directions of the fixed layer 12 and recording layer 14 are changed from the parallel state to the anti-parallel state as shown in FIG. 3(b), a write current I2 that flows from the fixed layer 12 to the recording layer 14 via the tunnel barrier layer 13 is supplied to the MTJ element 10. As a result, spin-polarized electrons are injected into the recording layer 14 and magnetization inversion of the recording layer 14 occurs when the critical current is exceeded. Therefore, the magnetization directions of the fixed layer 12 and recording layer 14 are set to the anti-parallel state.

Figure 4:
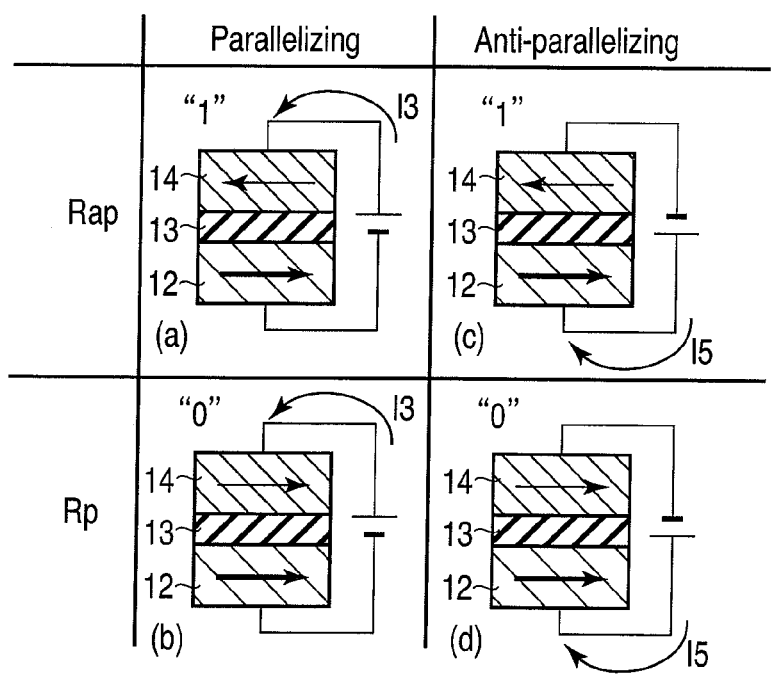
FIG. 4 is a view for illustrating the direction of a read current when data is read from the MTJ element 10.

FIG. 4 is a view for illustrating the direction of a read current when data is read from the MTJ element 10. In FIG. 4, four reading states (FIG. 4(a) to FIG. 4(d)) corresponding to two directions of the read current and two resistance states are shown. Further, the resistance in a state in which the magnetization directions of the fixed layer 12 and recording layer 14 are set anti-parallel, that is, the resistance in the high-resistance state ("1" state) is set to Rap and the resistance in a state in which the magnetization directions of the fixed layer 12 and recording layer 14 are set parallel, that is, the resistance in the low-resistance state ("0" state) is set to Rp.

As shown in FIG. 4(a) and FIG. 4(c), the direction of a read current when "1" data is read includes a direction of a read current I3 that flows from the recording layer 14 to the fixed layer 12 and a direction of a read current I5 that flows from the fixed layer 12 to the recording layer 14. At this time, the state in which the read current I3 flows from the recording layer 14 to the fixed layer 12 is the same as the state in which "0" data is written as shown in FIG. 3(a). In this case, the recording layer 14 receives a disturbance caused by the read current I3 since the read current I3 applies spin torque to the recording layer 14.

Likewise, as shown in FIG. 4(b) and FIG. 4(d), the direction of a read current when "0" data is read includes the direction of the read current I3 that flows from the recording layer 14 to the fixed layer 12 and the direction of the read current I5 that flows from the fixed layer 12 to the recording layer 14. At this time, the state in which the read current I5 flows from the fixed layer 12 to the recording layer 14 is the same as the state in which "1" data is written as shown in FIG. 3(b). In this case, the recording layer 14 receives a disturbance caused by the read current I5 since the read current I5 applies spin torque to the recording layer 14.

Thus, a disturbance may occur in the read process of "1" data shown in FIG. 4(a) when the read current I3 flows from the recording layer 14 to the fixed layer 12 as shown in FIG. 4(a) and FIG. 4(b). Further, a disturbance may occur in the read process of "0" data shown in FIG. 4(d) when the read current I5 flows from the fixed layer 12 to the recording layer 14 as shown in FIG. 4(c) and FIG. 4(d).

In a case where a write current is passed in the same direction as that of the read current I3 shown in FIG. 4(a) and FIG. 4(b), both of the magnetization directions are set parallel and the directions are called a Parallelizing direction. Further, in a case where a write current is passed in the same direction as that of the read current I5 shown in FIG. 4(c) and FIG. 4(d), both of the magnetization directions are set anti-parallel and the directions are called an Anti-parallelizing direction.

Figure 5:
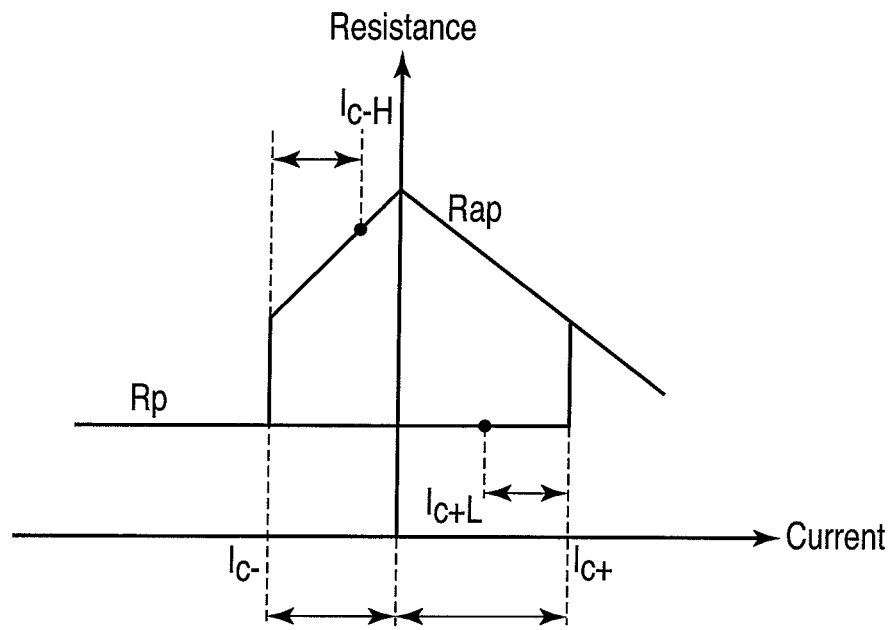
FIG. 5 is a graph showing the relationship between the write critical current and the resistance of the MTJ element 10.

Next, the critical current in which inversion of magnetization occurs by spin transfer is explained. FIG. 5 is a graph showing the relationship between the critical current in which inversion of magnetization occurs and the resistance of the MTJ element 10. In FIG. 5, the abscissa indicates a current and the ordinate indicates a resistance value.

The critical current used to write "1" data is set to $I_{c+}$ and the critical current used to write "0" data is set to $I_{c-}$. The magnitudes of $I_{c+}$ and $I_{c-}$ are generally different due to the difference in the origin of the magnetization inversion physics. If the read currents in directions that may cause the disturbance as described in FIG. 4 are set to $I_{c+L}$ and $I_{c-H}$ (shown in FIG. 5), the above values are expressed by the following equations under the constant voltage (that is set to $\Delta V$).

$$|I_{c+L}| = \Delta V/Rp \quad (1)$$

$$|I_{c-H}| = \Delta V/Rap \quad (2)$$

where "||" is a symbol representing the absolute value.

Further, the MR ratio indicating that the resistance of the "1" state is Rap and the resistance of the "0" state is Rp is expressed by the following equation.

$$MR\ ratio = (Rap - Rp)/Rp \quad (2)$$

In this case, the disturbance caused by the read current is formulated. The disturbance occurs with a constant probability, the disturbance tends to occur as the read current becomes larger with respect to the write critical current and the disturbance occurs less as the read current becomes smaller. Therefore, an optimum read direction can be determined based on the magnitude relationship of the ratio between the critical current and the read current.

The magnitude relationship is expressed by the following expressions.

$$I_{c+L}/I_{c+} \geq |I_{c-H}/I_{c-}| \quad (4)$$

$$I_{c+L}/I_{c+} \leq |I_{c-H}/I_{c-}| \quad (5)$$

In order to prevent occurrence of the disturbance, it is optimum to set the read current in the Parallelizing direction in the expression (4) and in the Anti-parallelizing direction in the expression (5).

The above expressions are rewritten as follows by use of MR ratios, $I_{c+}$, $I_{c-}$ based on the equations (1) and (2).

$$MR\ ratio \geq |I_{c+}/I_{c-}| - 1 \quad (6)$$

$$MR\ ratio \leq |I_{c+}/I_{c-}| - 1 \quad (7)$$

Figure 6:
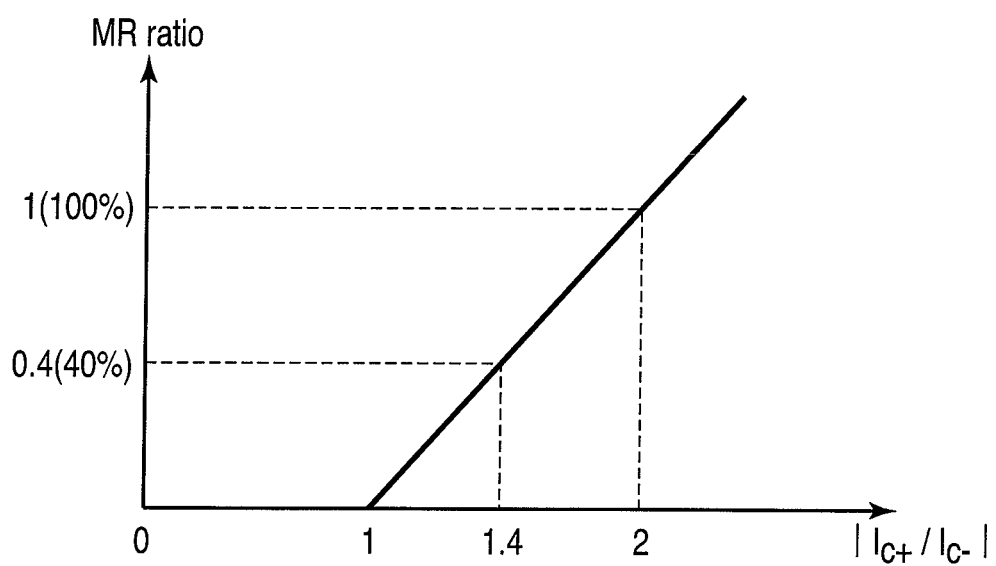
FIG. 6 is a graph showing the relationship between the MR ratio and the write critical current ratio.
Figure 7:
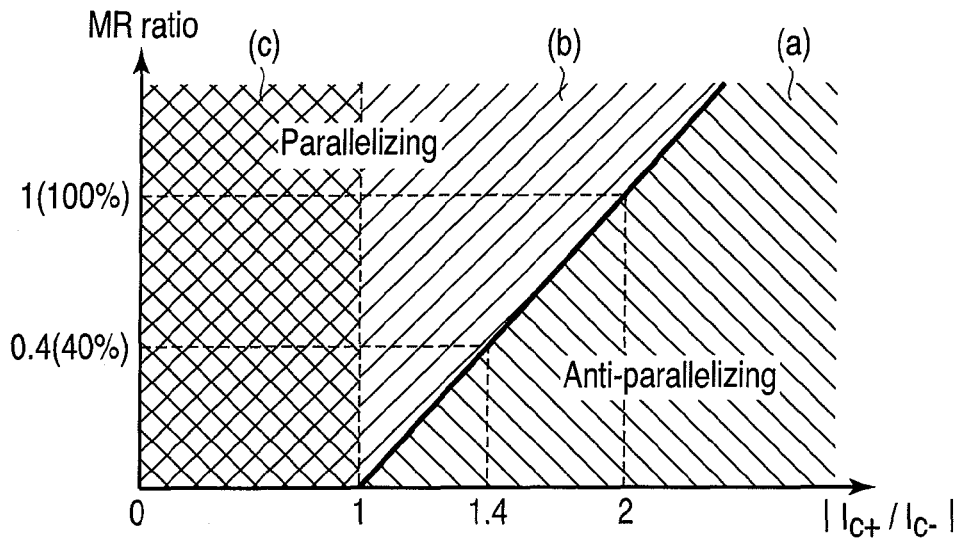
FIG. 7 is a graph showing FIG. 6 divided for respective regions according to the direction of the read current.

A graph obtained by plotting the expressions (6) and (7) is shown in FIG. 6. The read direction can be determined based on the relationship between the MR ratio and the write critical current ratio $|I_{c+}/I_{c-}|$. The details are explained next with reference to FIG. 7. FIG. 7 is obtained based on splitting up FIG. 6 into characteristic regions.

In a region (a) shown in FIG. 7, it is optimum to set the read current in the Anti-parallelizing direction. Further, in a region (b), it is optimum to set the read current in the Parallelizing direction. For example, in a case where $|I_{c+}/I_{c-}|$ is set approximately equal to 1.4, the read current may be set in the Anti-parallelizing direction if the MR ratio is smaller than 0.4 (40%) and the read current may be set in the Parallelizing direction if the MR ratio is larger than 0.4 (40%).

Further, in a region (c) of $|I_{c+}/I_{c-}| \leq 1$, the read current may be set in the Parallelizing direction irrespective of the MR ratio. Particularly, a case wherein $I_{c+}$ and $I_{c-}$ are equal to each other is included in the above case.

Thus, erroneous writing (write disturbance) caused by the read process can be suppressed by determining the direction of the read current based on the magnitude relationship between the MR ratio and the write critical current ratio $|I_{c+}/I_{c-}|$. Next, an example of the configuration of the MRAM utilizing the above MTJ element 10 and the read method of this embodiment is explained.

(Configuration Example of MRAM)

Figure 8:
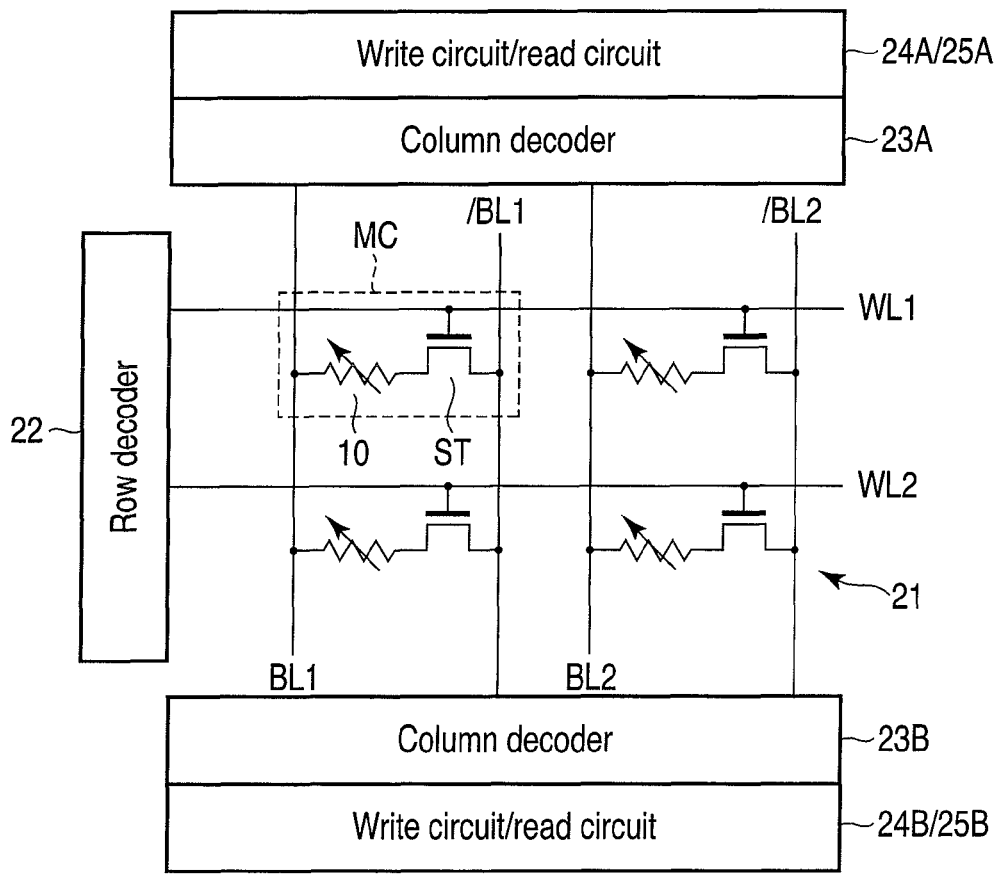
FIG. 8 is a block diagram showing the configuration of the MRAM.

FIG. 8 is a block diagram showing the configuration of the MRAM according to the first embodiment. In a memory cell array 21, plural bit line pairs BL, /BL extending in a column direction are arranged and plural word lines WL extending in a row direction intersecting with the column direction are arranged. Each memory cell MC is arranged in an intersection area between one bit line pair BL, /BL and one word line WL and thus the memory cells MC are arranged in a matrix form to configure the memory cell array 21. For simplifying the explanation, in FIG. 8, two bit line pairs BL1 and BL2, /BL1 and /BL2, two word lines WL1 and WL2 and four memory cells MC are shown, but in practice, the memory cell array 21 is configured by use of a larger number of memory cells MC.

For example, one memory cell MC includes one select transistor ST and one MTJ element 10. For example, the select transistor ST is configured by an n-channel metal oxide semiconductor field effect transistor (MOSFET). One end of the MTJ element 10 is electrically connected to the bit line BL and the other end thereof is electrically connected to one end of the current path of the select transistor ST. The other end of the current path of the select transistor ST is electrically connected to the bit line /BL and the gate thereof is electrically connected to the word line WL.

The MTJ element 10 is configured as shown in FIG. 1. Each of the fixed layer 12 and recording layer 14 is not limited to the single layer as shown in the drawing. For example, at least one of the fixed layer 12 and recording layer 14 may be formed to have a laminated structure formed of plural ferromagnetic layers.

Further, at least one of the fixed layer 12 and recording layer 14 may be formed with an anti-ferromagnetic coupling structure that is formed of three layers including a first ferromagnetic layer/nonmagnetic layer/second ferromagnetic layer and in which the first and second ferromagnetic layers are magnetically coupled (exchangeably coupled) with the magnetization directions thereof set in the anti-parallel state. Further, the above layer may be formed with a ferromagnetic coupling structure in which the first and second ferromagnetic layers are magnetically coupled (exchangeably coupled) with the magnetization directions thereof set in the parallel state.

The MTJ element 10 may be formed with a double-junction structure. The MTJ element with the double-junction structure is configured by sequentially stacking a first fixed layer, first nonmagnetic layer, free layer, second nonmagnetic layer and second fixed layer. The double-junction structure has an advantage in that magnetic inversion can be induced by use of a small write current and the MR ratio can be made larger in comparison with a single-junction structure.

As the ferromagnetic material of the fixed layer 12 and recording layer 14, for example, one of Co, Fe and Ni or an alloy containing at least one of the above materials can be used.

If a metal is used as the nonmagnetic layer 13, one of Au, Cu, Cr, Zn, Ga, Nb, Mo, Ru, Pd, Ag, Hf, Ta, W, Pt and Bi or an alloy containing at least one of the above materials can be used. Further, if the nonmagnetic layer 13 is formed to function as a tunnel barrier layer, an insulating oxide such as $Al_2O_3$, MgO or CaO can be used.

As the material of the anti-ferromagnetic layer, for example, Fe—Mn, Pt—Mn, Pt—Cr—Mn, Ni—Mn, Pd—Mn or the like can be used.

A row decoder 22 is connected to the word lines WL. The row decoder 22 selects one of the word lines WL based on an address supplied from the exterior. Column decoders 23A, 23B are connected to the bit line pairs BL, /BL. The column decoders 23A, 23B select one of the bit line pairs BL, /BL based on an address supplied from the exterior.

Further, write circuits 24A, 24B and read circuits 25A, 25B are connected to the bit line pairs BL, /BL via the column decoders 23A, 23B. The write circuits 24A, 24B supply a current of a direction corresponding to data to the memory cell MC via the bit line pair BL, /BL. The read circuits 25A, 25B each contain a sense amplifier. The read circuits 25A, 25B supply a read current to a to-be-read memory cell MC. Then, the read current is compared with a reference current by means of the sense amplifier to detect data stored in the memory cell MC.

Next, the operation of the MRAM is explained. In the write and read operations described below, a case wherein the fixed layer 12 is connected to the select transistor ST via the electrode is considered, but the directions of the write and read currents may be reversed in a case wherein the recording layer 14 is connected to the select transistor ST via the electrode.

When data is written to the memory cell MC, one of the word lines WL that is connected to a to-be-written memory cell MC is selected by means of the row decoder 22 and the select transistor ST of the above memory cell MC is turned on. Further, the bit line pair BL, /BL connected to the above memory cell MC is selected by means of the column decoders 23A, 23B. Then, the write circuits 24A, 24B supply a write current of a direction corresponding to data to the memory cell MC via the selected bit line pair BL, /BL. As a result, the MTJ element 10 is set to a magnetization state corresponding to the direction in which the write current flows.

When data is read from the memory cell MC, one of the word lines WL that is connected to a to-be-read memory cell MC is selected by means of the row decoder 22 and the select transistor ST of the above memory cell MC is turned on. Further, the bit line pair BL, /BL connected to the above memory cell MC is selected by means of the column decoders 23A, 23B. Subsequently, the read circuits 25A, 25B supply a read current to the memory cell MC via the selected bit line pair BL, /BL. Then, the read current flowing in the memory cell MC is compared with the reference current by means of the sense amplifiers in the read circuits 25A, 25B to detect data stored in the memory cell MC.

In the process of reading data in this embodiment, the direction of the read current flowing in the MTJ element 10 is previously determined. As described before, the direction of the read current can be unconditionally (uniquely) determined based on the magnitude relationship between the MR ratio and the write critical current ratio $|I_{c+}/I_{c-}|$. This is determined by previously measuring the characteristic of the MTJ element 10 and calculating the MR ratio of the MTJ element 10 and the write critical current ratio $|I_{c+}/I_{c-}|$.

More specifically, in the region (a) shown in FIG. 7, the read process is performed by passing a read current in a direction from the read circuit 25B to the read circuit 25A. Further, in the regions (b) and (c) shown in FIG. 7, the read process is performed by passing a read current in a direction from the read circuit 25A to the read circuit 25B. The read circuits 25A, 25B are configured to pass the read current in the thus determined direction. Specifically, current sources and sense amplifiers configuring the read circuits 25A, 25B are arranged to serve the above purpose.

As described above in detail, in the first embodiment, the MR ratio of the MTJ element 10 and the write critical current ratio $|I_{c+}/I_{c-}|$ are calculated and the read current is passed in a direction to suppress a disturbance caused by the read current based on the relationship between the MR ratio and the write critical current ratio $|I_{c+}/I_{c-}|$. Therefore, according to the first embodiment, erroneous writing (write disturbance) occurring at the data read time can be suppressed.

(Second Embodiment)

In the second embodiment, a disturbance caused by a read current is formulated by use of a write current instead of the write critical current explained in the first embodiment. Then, the direction of the read current is determined by use of the MR ratio and write current ratio.

It is assumed that a write current used to write "1" data is set to $I_{w+}$ and a write current used to write "0" data is set to $I_{w-}$. The critical current $I_{c+}$ (or $I_{c-}$) in plural MTJ elements 10 configuring a memory cell array 21 has a variation and this means that the magnitudes of currents by use of which data can be written in the respective MTJ elements 10 are different. Therefore, the write current is generally a current by use of which data can be written in all of the MTJ elements 10 configuring the memory cell array 21 by taking the variation in the critical current into consideration.

If a range of, for example, $3\sigma$ is considered by using a standard deviation $\sigma$ derived based on a variation in the critical current $I_{c+}$, the write current $I_{w+}$ is expressed by the following equation.

$$|I_{w+}| = |I_{c+}| + 3\sigma \tag{8}$$

Since the standard deviation $\sigma$ varies in proportion to the critical current $I_{c+}$, it is expressed by the following equation.

$$\sigma = A \times |I_{c+}| \ (A \text{ is a proportional coefficient}) \tag{9}$$

The write current $I_{w+}$ is expressed by the following equation by use of the equations (8) and (9).

$$|I_{w+}| = (1 + 3A) \times |I_{c+}| \tag{10}$$

Likewise, the write current $I_{w-}$ is expressed by the following equation by considering a range of, for example, $3\sigma$ by using a standard deviation $\sigma$ derived based on a variation in the critical current $I_{c-}$.

$$|I_{w-}| = |I_{c-}| + 3\sigma \tag{11}$$

Since the standard deviation $\sigma$ varies in proportion to the critical current $I_{c-}$, it is expressed by the following equation.

$$\sigma = B \times |I_{c-}| \ (B \text{ is a proportional coefficient}) \tag{12}$$

The write current $I_{w-}$ is expressed by the following equation by use of the equations (11) and (12).

$$|I_{w-}| = (1 + 3B) \times |I_{c-}| \tag{13}$$

Since it is considered that the proportional coefficients A and B in the equations (9) and (12) are equal to each other, the relationship between the write current and critical current is expressed by the following equation based on the equations (10) and (13).

$$|I_{w+}/I_{w-}| = |I_{c+}/I_{c-}| \tag{14}$$

It is derived from the equation (14) that the critical current ratio is equal to the write current ratio determined based on the equations (8) and (11). Therefore, the first embodiment under the critical current can be applied to the write current.

Specifically, the relationship between the MR ratio and the write current ratio $|I_{w+}/I_{w-}|$ is expressed by the following expressions.

$$MR \text{ ratio} \geq |I_{w+}/I_{w-}| - 1 \tag{15}$$

$$MR \text{ ratio} \leq |I_{w+}/I_{w-}| - 1 \tag{16}$$

Therefore, the read current is set in the Parallelizing direction in the case of the expression (15) and set in the Anti-parallelizing direction in the case of the expression (16) based on the relationship between the MR ratio and the write current ratio $|I_{w+}/I_{w-}|$.

The configuration of the MRAM according to the second embodiment is also the same as that shown in FIG. 8 explained in the first embodiment. In the process of reading data, the direction of the read current flowing in the MTJ element 10 is previously determined. As described before, the direction of the read current can be unconditionally determined based on the magnitude relationship between the MR ratio and the write current ratio $|I_{w+}/I_{w-}|$. This is determined by previously measuring the characteristic of the MTJ element 10 and calculating the MR ratio of the MTJ element 10 and the write current ratio $|I_{w+}/I_{w-}|$.

A graph indicating the relationship between the MR ratio and the write current ratio $|I_{w+}/I_{w-}|$ in the second embodiment can be attained by reading the abscissa to indicate the write current ratio $|I_{w+}/I_{w-}|$ in FIG. 7 explained in the first embodiment. The direction of the read current is determined as follows with reference to FIG. 7. In the range of the region (a) shown in FIG. 7, the read process is performed by passing a read current in a direction from the read circuit 25B to the read circuit 25A. Further, in the range of the regions (b) and (c) shown in FIG. 7, the read process is performed by passing a read current in a direction from the read circuit 25A to the read circuit 25B. The read circuits 25A, 25B are configured to pass the read current in the thus determined direction. Specifically, current sources and sense amplifiers configuring the read circuits 25A, 25B are arranged to serve the above purpose.

As described above in detail, in the second embodiment, the MR ratio of the MTJ element 10 and the write current ratio $|I_{w+}/I_{w-}|$ are calculated and the read current is passed in a direction to suppress a disturbance caused by the read current based on the relationship between the MR ratio and the write current ratio $|I_{w+}/I_{w-}|$. Therefore, like the first embodiment, according to the second embodiment, occurrence of erroneous writing (write disturbance) at the data read time can be more effectively suppressed.

In the above embodiments, the configuration example of the MRAM using the MTJ elements is shown, but the above embodiments can be applied to another resistance-change memory. For example, the above embodiments can be applied to a resistive random access memory (RERAM), phase-change random access memory (PCRAM) and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
a magnetoresistive element comprising a fixed layer whose magnetization direction is fixed, a recording layer whose magnetization direction is variable and a nonmagnetic layer disposed between the fixed layer and the recording layer,
wherein an MR ratio is expressed by MR ratio $=(Rap-Rp)/Rp$ if a resistance value obtained when the magnetization directions of the fixed layer and recording layer are set to a parallel state is set to Rp and a resistance value obtained when the magnetization directions of the fixed layer and recording layer are set to an anti-parallel state is set to Rap, and
a direction of a read current is set to a first direction in a case where an expression of MR ratio $\geq |I_{c+}/I_{c-}|-1$ is satisfied if a critical current of the first direction used to write the magnetoresistive element to the parallel state is set to $I_{c-}$ and a critical current of a second direction used to write the magnetoresistive element to the anti-parallel state is set to $I_{c+}$.

2. The memory of claim 1, further comprising a read circuit configured to supply the read current to the magnetoresistive element when reading data.

3. The memory of claim 1, further comprising a write circuit configured to supply a write current of one of the first and second directions to the magnetoresistive element according to write data when writing data.

4. The memory of claim 1, wherein the direction of the read current is set to the second direction when a value of the MR ratio is less than or equal to $|I_{c+}/I_{c-}|-1$.

5. The memory of claim 4, wherein
the direction of the read current is set to the first direction when a value of the MR ratio is greater than or equal to $|I_{w+}/I_{w-}|-1$,
$I_{w-}$ represents a write current in the first direction used to write the magnetoresistive element to the parallel state, and
$I_{w+}$ represents a write current in the second direction used to write the magnetoresistive element to the anti-parallel state.

6. The memory of claim 5, wherein the direction of the read current is set to the second direction when a value of the MR ratio is less than or equal to $|I_{w+}/I_{w-}|-1$.

7. The memory of claim 1, wherein
the direction of the read current is set to the first direction when a value of the MR ratio is greater than or equal to $|I_{w+}/I_{w-}|-1$,
$I_{w-}$ represents a write current in the first direction used to write the magnetoresistive element to the parallel state, and
$I_{w+}$ represents a write current in the second direction used to write the magnetoresistive element to the anti-parallel state.

8. The memory of claim 1, wherein
the direction of the read current is set to the second direction when a value of the MR ratio is less than or equal to $|I_{w+}/I_{w-}|-1$,
$I_{w-}$ represents a write current in the first direction used to write the magnetoresistive element to the parallel state, and
$I_{w+}$ represents a write current in the second direction used to write the magnetoresistive element to the anti-parallel state.

* * * * *